(12) United States Patent
Zhao et al.

(10) Patent No.: US 11,533,025 B2
(45) Date of Patent: Dec. 20, 2022

(54) INTEGRATED DOHERTY AMPLIFIER WITH ADDED ISOLATION BETWEEN THE CARRIER AND THE PEAKING TRANSISTORS

(71) Applicant: Wolfspeed, Inc., Durham, NC (US)

(72) Inventors: Lei Zhao, Chandler, AZ (US); Fabian Radulescu, Chapel Hill, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 16/905,488

(22) Filed: Jun. 18, 2020

(65) Prior Publication Data

US 2021/0399694 A1    Dec. 23, 2021

(51) Int. Cl.
*H03F 3/195* (2006.01)
*H03F 1/02* (2006.01)

(52) U.S. Cl.
CPC .......... *H03F 3/195* (2013.01); *H03F 1/0288* (2013.01); *H03F 2200/451* (2013.01)

(58) Field of Classification Search
CPC ... H03F 3/195; H03F 1/0288; H03F 2200/451
USPC ....................................................... 330/277
See application file for complete search history.

(56) References Cited

U.S. PATENT DOCUMENTS

| | | | |
|---|---|---|---|
| 4,946,547 A | 8/1990 | Palmour et al. | |
| 5,192,987 A | 3/1993 | Khan et al. | |
| 5,210,051 A | 5/1993 | Carter, Jr. | |
| 5,200,022 A | 8/1993 | Kong et al. | |
| 5,296,395 A | 3/1994 | Khan et al. | |
| RE34,861 E | 2/1995 | Davis et al. | |
| 5,393,993 A | 2/1995 | Edmond et al. | |
| 5,523,589 A | 6/1996 | Edmond et al. | |
| 6,218,680 B1 | 4/2001 | Carter, Jr. et al. | |
| 6,316,793 B1 | 11/2001 | Sheppard et al. | |
| 6,548,333 B2 | 4/2003 | Smith | |
| 7,030,428 B2 | 4/2006 | Saxler | |
| 7,045,404 B2 | 5/2006 | Sheppard et al. | |
| 7,544,963 B2 | 6/2009 | Saxler | |
| 7,548,112 B2 | 6/2009 | Sheppard | |
| 7,592,211 B2 | 9/2009 | Sheppard | |
| 7,615,774 B2 | 11/2009 | Saxler | |
| 7,709,269 B2 | 5/2010 | Smith et al. | |
| 8,049,252 B2 | 11/2011 | Smith et al. | |
| 8,120,064 B2 | 2/2012 | Parikh et al. | |

(Continued)

OTHER PUBLICATIONS

Elmala et al., "A 90nm CMOS Doherty Power Amplifier with Integrated Hybrid Coupler and Impedance Transformer", published in the 2007 IEEE Radio Frequency Integrated Circuits Symposium, pp. 423-426 (Year: 2007).*

(Continued)

*Primary Examiner* — Hafizur Rahman
(74) *Attorney, Agent, or Firm* — Coats & Bennett, PLLC

(57) ABSTRACT

The present disclosure relates to added isolation between transistors in a multiple path amplifier circuit. The multiple path amplifier circuit includes a substrate, a first transistor on the substrate in a first path, and a second transistor on the substrate in a second path. The multiple path amplifier circuit also includes at least one electrical connection associated with the first and the second transistors and positioned to at least partially extend between the first path and the second path.

13 Claims, 12 Drawing Sheets

(56) References Cited

U.S. PATENT DOCUMENTS

| | | | |
|---|---|---|---|
| 9,947,616 B2 | 4/2018 | Wood et al. | |
| 11,050,388 B2* | 6/2021 | Wang | H03F 3/195 |
| 2015/0180428 A1* | 6/2015 | Pham | H03F 1/48 |
| | | | 330/295 |
| 2020/0014342 A1* | 1/2020 | Jones | H03F 1/0288 |
| 2021/0126593 A1* | 4/2021 | Roberts | H03F 1/565 |

OTHER PUBLICATIONS

Hachman, M., "Intel to Produce 90-nm Communications Process", Sep. 16, 2002, published in Extreme Tech news letter (Year: 2002).*

Sajedin et al. "A Survey on RF and Microwave Doherty Power Amplifier for Mobile Handset Applications", published in Electronics 2019, 8, 717 https://www.mdpi.com/journal/electronics, pp. 1-31 (Year: 2019).*

Li et al., "Design of a Compact GaN MMIC Doherty Power Amplifier and System Level Analysis With X-Parameters for 5G Communications", IEEE Transactions on Microwave Theory and Techniques, vol. 66, No. 12, Dec. 2018 (Year: 2018).*

Camarchia et al., "Evolution of Monolithic Technology for Wireless Communications: GaN MMIC Power Amplifiers for Microwave Radios", Micromachines 2014, 5, 711-721; doi:10.3390/mi5030711. (Year: 2014).*

Li et al., "A Sub-6 GHz Compact GaN MMIC Doherty PA with a 49.5% 6 dB back-off PAE for 5G Communications", published in 2018 IEEE/MTT-S International Microwave Symposium. (Year: 2018).*

Ali Hajimiri, "Distributed Integrated Circuits", Wideband Communications for the 21st Century, Engenious winter 2003. (Year: 2003).*

Gustafsson et al, "A Wideband and Compact GaN MMIC Doherty Amplifier for Microwave Link Applications", IEEE Transactions on Microwave Theory and Techniques, vol. 61, No. 2, Feb. 2013, pp. 922-930. (Year: 2013).*

Kaymaksut et al., "CMOS Transformer-Based Uneven Doherty Power Amplifier for WLAN Applications", 2011 IEEE. (Year: 2011).*

* cited by examiner

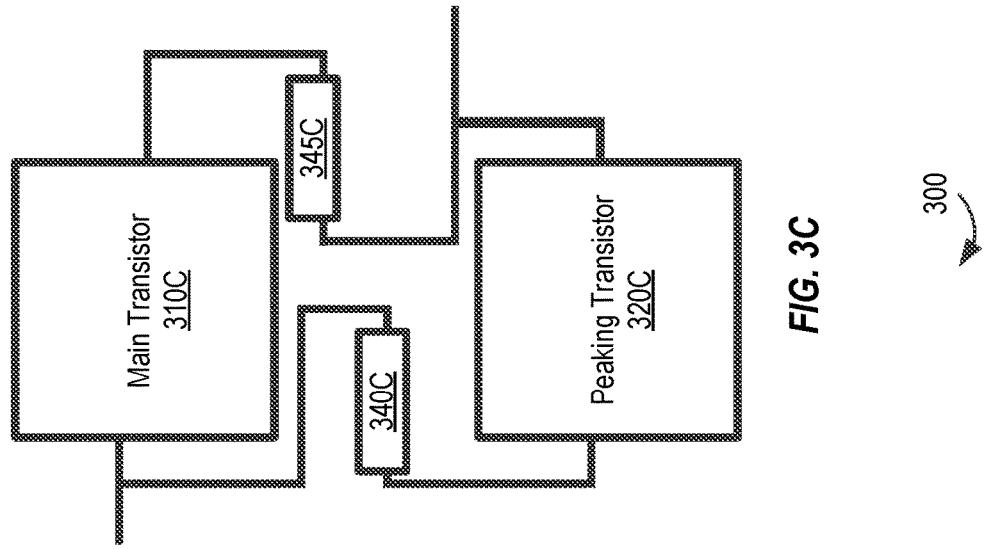
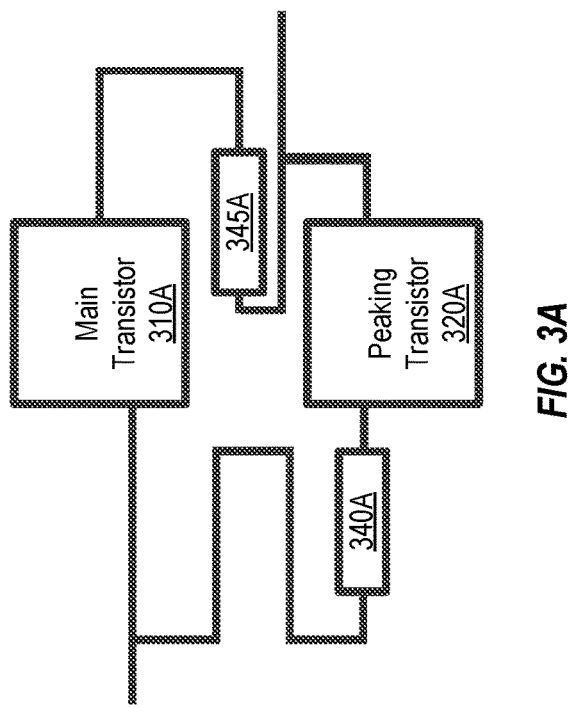
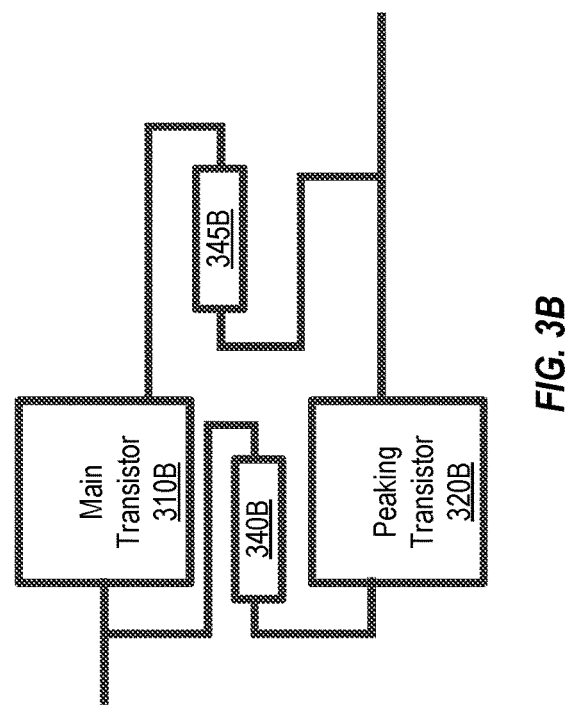

INTEGRATED DOHERTY AMPLIFIER WITH ADDED ISOLATION BETWEEN THE CARRIER AND THE PEAKING TRANSISTORS

BACKGROUND

RF amplifiers are widely used in cellular communications systems and other applications. RF amplifiers are typically formed as semiconductor integrated circuit chips. Most RF amplifiers are implemented in silicon or using wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF amplifiers are typically implemented using laterally diffused metal oxide semiconductor ("LDMOS") transistors. Silicon LDMOS RF amplifiers can exhibit high levels of linearity and may be relatively inexpensive to fabricate. Group III nitride-based RF amplifiers are typically implemented using High Electron Mobility Transistors ("HEMT") and are primarily used in applications requiring high power and/or high frequency operation where LDMOS transistor amplifiers may have inherent performance limitations.

RF amplifiers may include one or more amplification stages, with each stage typically implemented as a transistor amplifier. In order to increase the output power and current handling capabilities, RF amplifiers are typically implemented in a "unit cell" configuration in which a large number of individual "unit cell" transistors are arranged electrically in parallel. The RF amplifier may be implemented as a single integrated circuit chip or "die," or may include a plurality of dies. When multiple RF amplifier die are used, they may be connected in series and/or in parallel.

RF amplifiers often include matching circuits, such as impedance matching circuits, that are designed to improve the impedance match between an RF amplifier die and transmission lines connected thereto for RF signals at the fundamental operating frequency and harmonic termination circuits that are designed to at least partly terminate harmonics that may be generated during device operation such as second and third order harmonics. The RF amplifier die(s) as well as the impedance matching and harmonic termination circuits may be enclosed in a package. Electrical leads may extend from the package that are used to electrically connect the RF amplifier to external circuit elements such as input and output RF transmission lines and bias voltage sources.

As noted above, Group III nitride-based RF amplifiers are often used in high power and/or high frequency applications. Typically, high levels of heat are generated within the Group III nitride-based RF amplifier die(s) during operation. If the RF die(s) become too hot, the performance (e.g., output power, efficiency, linearity, gain, etc.) of the RF amplifier may deteriorate and/or the RF amplifier die(s) may be damaged. As such, Group III nitride-based RF amplifiers are typically mounted in packages that may be optimized for heat removal. FIGS. 1A and 1B illustrate a conventional packaged Group III nitride-based RF amplifier. In particular, FIG. 1A is a schematic side view of a conventional packaged Group III nitride-based RF amplifier 100, and FIG. 1B is a schematic cross-sectional view of the RF transistor amplifier die that is included in the packaged Group III nitride-based RF transistor amplifier 100, where the cross-section is taken along line 1B-1B of FIG. 1A. It will be appreciated that FIGS. 1A-1B (and various of the other figures) are highly simplified diagrams and that actual RF amplifiers may include many more unit cells and various circuitry and elements that are not shown in the simplified figures herein.

As shown in FIG. 1A, the Group III nitride-based RF amplifier 100 includes an RF amplifier die 110 that is mounted within an open cavity package 170. The package 170 includes a gate lead 172, a drain lead 174, a metal flange 176 and a ceramic sidewall and lid 178. The RF transistor amplifier die 110 is mounted on the upper surface of the metal flange 176 in a cavity formed by the metal flange 176 and the ceramic sidewall and lid 178. The RF amplifier die 110 has a top side 112 and a bottom side 114. The RF amplifier die 110 includes a bottom side (also referred to as a "back" side) metallization structure 120, a semiconductor layer structure 130 and a top side metallization structure 140 that are sequentially stacked. The back side metallization structure 120 comprises a source terminal 126. The RF amplifier 100 may be a HEMT-based RF amplifier, in which case the semiconductor layer structure 130 may include at least a channel layer and a barrier layer, which are typically formed on a semiconductor or insulating growth substrate (such as a SiC or sapphire substrate). The top side metallization structure 140 includes, among other things, a gate terminal 142 and a drain terminal 144.

Input matching circuits 190 and/or output matching circuits 192 may also be mounted within the housing 170. The matching circuits 190, 192 may be impedance matching circuits that match the impedance of the fundamental component of RF signals input to or output from the RF transistor amplifier 100 to the impedance at the input or output of the RF transistor amplifier die 110, respectively, and/or harmonic termination circuits that are configured to short to ground harmonics of the fundamental RF signal that may be present at the input or output of the RF transistor amplifier die 110, such as second order or third order harmonics. As schematically shown in FIG. 1A, the input and output matching circuits 190, 192 may be mounted on the metal flange 176. The gate lead 172 may be connected to the input matching circuit 190 by one or more first bond wires 182, and the input matching circuit 190 may be connected to the gate terminal 142 of RF amplifier die 110 by one or more second bond wires 183. Similarly, the drain lead 174 may be connected to the output matching circuit 192 by one or more fourth bond wires 185, and the output matching circuit 192 may be connected to the drain terminal 144 of RF amplifier die 110 by one or more third bond wires 184. The source terminal 126 of RF transistor amplifier die 110 may be mounted directly on the metal flange 176. The metal flange 176 may provide the electrical connection to the source terminal 126 and may also serve as a heat dissipation structure. The first through fourth bond wires 182-185 may form part of the input and/or output matching circuits. The housing 178 may comprise a ceramic housing, and the gate lead 172 and the drain lead 174 may extend through the housing 178. The housing 178 may comprise multiple pieces, such as a frame that forms the lower portion of the sidewalls and supports the gate and drain leads 172, 174, and a lid that is placed on top of the frame. The interior of the device may comprise an air-filled cavity.

FIG. 1B is a schematic cross-sectional view of the RF amplifier die 110 that is taken through a portion of the top side metallization structure 140. Dielectric layers that isolate the various conductive elements of the top-side metallization structure 140 from each other are not shown in FIG. 1B to simplify the drawing.

As shown in FIG. 1B, the RF amplifier die 110 comprises a Group III nitride-based HEMT RF amplifier that has a plurality of unit cell transistors 116 that each include a gate finger 152, a drain finger 154 and a source finger 156. The gate fingers 152 are electrically connected to a common gate bus 146, and the drain fingers 154 are electrically connected to a common drain bus 148. The gate bus 146 is electrically connected to the gate terminal 142 (e.g., through a conductive via that extends upwardly from the gate bus 146) which is implemented as a gate bond pad (see FIG. 1A), and the drain bus 148 is electrically connected to the drain terminal 144 (e.g., through a conductive via that extends upwardly from the drain bus 148) which is implemented as a drain bond pad (see FIG. 1A). The source fingers 156 are electrically connected to the source terminal 126 via a plurality of conductive source vias 166 that extend through the semiconductor layer structure 130. The conductive source vias 166 may comprise metal-plated vias that extend completely through the semiconductor layer structure 130.

Referring again to FIG. 1A, the metal flange 176 may act as a heat sink that dissipates heat that is generated in the RF amplifier die 110. The heat is primarily generated in the upper portion of the RF amplifier die 110 where relatively high current densities are generated in, for example, the channel regions of the unit cell transistors 116. This heat may be transferred though both the source vias 166 and the semiconductor layer structure 130 to the metal flange 176.

FIG. 1C is a schematic cross-sectional view of a conventional HEMT device 1000. For example, FIG. 1C can be a cross section of FIG. 1B as outlined by the unit cell transistors 116. A semiconductor structure 1090, such as a semiconductor structure for a Group III nitride semiconductor HEMT, may be formed on a substrate 1022 such as a SiC substrate or a sapphire substrate. The substrate 1022 may be a semi-insulating SiC substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc. The term "semi-insulating" is used descriptively herein, rather than in an absolute sense.

In some embodiments of the present invention, the SiC bulk crystal of the substrate 1022 may have a resistivity equal to or higher than about $1 \times 10^5$ ohm-cm at room temperature. Exemplary SiC substrates that may be used in some embodiments of the present invention are manufactured by, for example, Cree, Inc., of Durham, N.C., the assignee of the present invention. Methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although SiC can be used as a substrate material, embodiments of the present application may utilize any suitable substrate. The substrate 1022 can be an SiC wafer, and the HEMT device 1000 can be formed, at least in part, via wafer-level processing, and the wafer can then be diced to provide a plurality of individual HEMTs 1000.

As shown in FIG. 1C, a channel layer 1024 is formed on an upper surface 1022B of the substrate 1022, and a barrier layer 1026 is formed on an upper surface of the channel layer 1024. The channel layer 1024 and the barrier layer 1026 can each be formed by epitaxial growth in some embodiments. Techniques for epitaxial grown of Group III nitrides have been described in, for example, U.S. Pat. Nos. 5,210,051, 5,393,993, and 5,523,589, the disclosures of which are also incorporated by reference herein in their entireties. The channel layer 1024 and the barrier layer 1026 can include Group III nitride-based materials.

While semiconductor structure 1090 is shown with channel layer 1024 and barrier layer 1026 for purposes of illustration, semiconductor structure 1090 can include additional layers/structures/elements such as a buffer and/or nucleation layer(s) between channel layer 1024 and substrate 1022, and/or a cap layer on barrier layer 1026. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface 1022B of the substrate 1022 to provide an appropriate crystal structure transition between the SiC substrate 1022 and the reminder of the HEMT device 1000. Additionally, strain balancing transition layer(s) can also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HYPE.

A source contact 1015 and a drain contact 1005 can be formed on an upper surface 1026A of the barrier layer 1026 and can be laterally spaced apart from each other. A gate contact 1010 can be formed on the upper surface 1026A of the barrier layer 1026 between the source contact 1015 and the drain contact 1005. The material of the gate contact 1010 can be chosen based on the composition of the barrier layer 1026, and may, in some embodiments, be a Schottky contact.

The source contact 1015 can be coupled to a reference signal such as, for example, a ground voltage. The coupling to the reference signal can be provided by a via 1025 that extends from a lower surface 1022A of the substrate 1022, through the substrate 1022 to an upper surface 1026A of the barrier layer. The via 1025 can expose a bottom surface of the ohmic portion 1015A of the source contact 1015. A backmetal layer 1035 can be formed on the lower surface 1022A of the substrate 1022 and on the side walls of the via 1025. The backmetal layer 1035 can directly contact the ohmic portion 1015A of the source contact 1015. The backmetal layer 1035 and a signal coupled thereto can be electrically connected to the source contact 1015.

The HEMT device 1000 can include a first insulating layer 1050 and a second insulating layer 1055. The first insulating layer 1050 can directly contact the upper surface of the semiconductor structure 1090 (e.g., contact the upper surface 1026A of the barrier layer 1026). The second insulating layer 1055 can be formed on the first insulating layer 1050. It will also be appreciated that more than two insulating layers can be included in some embodiments. The first insulating layer 1050 and the second insulating layer 1055 can serve as passivation layers for the HEMT device 1000.

The source contact 1015, the drain contact 1005, and the gate contact 1010 can be formed in the first insulating layer 1050. In some embodiments, at least a portion of the gate contact 1010 can be on the first insulating layer. In some embodiments, the gate contact 1010 can be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 1055 can be formed on the first insulating layer 1050 and on portions of the drain contact 1005, gate contact 1010, and source contact 1015.

In some embodiments, field plates 1060 can be formed on the second insulating layer 1055. At least a portion of a field plate 1060 can be on the gate contact 1010. At least a portion of the field plate 1060 can be on a portion of the second insulating layer 1055 that is between the gate contact 1010 and the drain contact 1005. Field plates and techniques for forming field plates are discussed, by way of example, in U.S. Pat. No. 8,120,064, the disclosure of which is hereby incorporated herein in its entirety by reference.

Metal contacts 1065 can be disposed in the second insulating layer 1055. The metal contacts 1065 can provide interconnection between the drain contact 1005, gate contact 1010, and source contact 1015 and other parts of the HEMT device 1000. Respective ones of the metal contacts 1065 can directly contact respective ones of the drain contact 1005 and/or source contact 1015.

FIG. 1D is a schematic side view of a conventional packaged Group III nitride-based RF transistor amplifier 100' that is similar to the RF transistor amplifier discussed above with reference to FIG. 1A. RF transistor amplifier 100' differs from RF transistor amplifier 100 in that it includes a different package 170'. The package 170' includes a metal submount 176 (which acts as a metal heat sink and can be implemented as a metal slug), as well as gate and drain leads 172', 174'. In some embodiments, a metal lead frame may be formed that is then processed to provide the metal submount 176 and/or the gate and drain leads 172', 174'. RF transistor amplifier 100' also includes a plastic overmold 170' that at least partially surrounds the RF transistor amplifier die 110, the leads 172', 174' and the metal submount 176. The plastic overmold 170' replaces the ceramic sidewalls and lid 178 included in RF transistor amplifier 100.

Depending on the embodiment, the packaged transistor amplifier 100' can include, for example, a monolithic microwave integrated circuit (MMIC) as the RF transistor amplifier die 110 in which case the RF transistor amplifier die 110 incorporates multiple discrete devices. When the RF transistor amplifier die 110 is a MMIC implementation, the input matching circuits 190 and/or the output matching circuits 192 may be omitted (since they may instead be implemented within the RF transistor amplifier die 110) and the bond wires 182 and/or 185 may extend directly from the gate and drain leads 172', 174' to the gate and drain terminals 142, 144. In some embodiments, the packaged RF transistor amplifier 100 can include multiple RF transistor amplifier die that are connected in series to form a multiple stage RF transistor amplifier and/or may include multiple transistor die that are disposed in multiple paths (e.g., in parallel) to form an RF transistor amplifier with multiple RF transistor amplifier die and multiple paths, such as in a Doherty amplifier configuration In other cases, Group III nitride-based RF amplifiers may be implemented as MMIC devices in which one or more RF amplifier die(s) are implemented together with their associated impedance matching and harmonic termination circuits in a single, integrated circuit die. Examples of such Group III nitride-based RF amplifiers are disclosed, for example, in U.S. Pat. No. 9,947,616, the entire content of which is incorporated herein by reference.

FIG. 1E is a cross-sectional view illustrating an example of a thermally enhanced integrated circuit device package, more specifically a T3PAC package 100". The T3PAC package 100" of FIG. 1E can be a ceramic-based package that includes a base 1201 and an upper housing with a lid member 178 and sidewall members 1204. The lid member 178 and sidewalls 1204 similarly define an open cavity surrounding the amplifier die 110 on the conductive base or flange 1201, which likewise provides both an attachment surface 1201 and thermal conductivity (e.g., a heat sink) for dissipating or otherwise transmitting heat outside of the package 100".

The flange 1201 can be an electrically conductive material, for example, a copper layer/laminate or an alloy or metal-matrix composite thereof. In some embodiments, the flange 1201 may include a copper-molybdenum (CuMo) layer, CPC (Cu/MoCu/Cu), or other copper alloys, such copper-tungsten CuW, and/or other laminate/multi-layer structures. In the example of FIG. 1E, the flange 1201 is illustrated as a copper-molybdenum (RCM60)-based structure to which the sidewalls 1204 and/or lid member 178 are attached, e.g., by a conductive glue 1208.

The flange 1201 also provides the source lead 102s for the package 100". The gate lead 102g and drain lead 102d are provided by respective conductive wiring structure 1214 which is attached to the flange 1201 and supported by the sidewall members 1204.

An example of a conventional Doherty amplifier 200A is schematically illustrated in the circuit diagram of FIG. 2A. In this example, the Doherty amplifier 200A comprises a main transistor 210A, a peaking transistor 220A, and first and second phase shifters 240A, 245A.

The Doherty amplifier 200A is configured to receive an input signal, split equally into two signals, one of which is directed towards a main transistor 210A and the other of which is directed towards a peaking transistor 220A. The signal directed toward the peaking transistor 220A passes through a first phase shifter 240A before reaching the peaking transistor 220A, such that the signals received at the main transistor 210A and peaking transistor 220A are out-of-phase. The outputs of the main transistor 210A and peaking transistor 220A are combined in-phase by passing the output of the main transistor 210A through a second phase shifter 245A. In this regard, the phase shifters 240A, 245A may be quarter-wave transmission lines of characteristic impedance respectively configured to introduce and remove a 90 degree phase shift between the signals.

As discussed above, the main transistor 210A and the peaking transistor 220A may be differently biased. In particular, the peaking transistor 210A may be much more heavily biased than the main transistor 220A. In this regard, the main transistor 210A may be a class AB or class B amplifier, whereas the peaking transistor 220A may be a class C amplifier. Accordingly, there may be an offset in the gate bias voltages between the transistors 210A, 220A. Notwithstanding, the main transistor 210A and peaking transistor 220A are designed to have matching operational threshold voltages. Among other things, the matching threshold voltages may enable the same bias offset between the transistors 210A, 220A to be used in a wide variety of products without having to adjust the Doherty amplifier on a product-by-product basis.

Integrated Doherty amplifiers are Doherty amplifiers that can have all or part of the amplifiers, matching networks, and/or combining networks integrated on one semiconductor chip. Doherty amplifiers can be one integrated die on a monolithic microwave integrated circuit (MMIC) or at a package level on discrete components. With higher levels of integration, integrated Doherty amplifiers can provide the customers with ease of use and faster cycle time. For example, having the main and peaking transistors 210A, 220A on the same die with matching turn-on characteristics may enable better and more consistent performance.

FIG. 2B illustrates an example layout of circuitry as used in a traditional outphasing amplifier 200B. The outphasing amplifier 200B comprises a signal separator 210B that provides input signals to a pair of transistor amplifiers 220B, 225B that produce amplified output signals that are out-of-phase from each other.

The output of each transistor 220B, 225B is coupled in parallel to a branch 240B, 245B towards ground and to a phase shifter 230B, 235B. The phase shifters 230B, 235B enable the outputs of the transistors 220B, 225B to be combined in-phase before proceeding to an output port 250B. The branches 240B, 245B provide load regulation so that the transistors 220B, 225B operate with higher efficiency. One of the branches may comprise a capacitor and the other may comprise an inductor, for example.

FIG. 2C illustrates an example layout of circuitry as used in a traditional feed forward amplifier 200C. The feed forward amplifier comprises two amplification stages, each comprising one transistor amplifier 210C, 220C. In the first stage, an input signal is split towards a first transistor 210C and a phase shifter 230C. The first transistor 210C provides primary amplification of the signal, whereas the first stage phase shifter 230C shifts the original signal by approximately 180 degrees. The amplified signal is sampled and combined in combiner 250C with the output of the phase shifter 230C to cancel out the original signal and obtain an error signal representing the distortion introduced by the primary amplification step. This error signal is passed to the second transistor 220C for amplification. The amplified signal from the first transistor 210C is sent to another phase shifter 240C for combination with combiner 260C out-of-phase with the amplified error from the second transistor to cancel the error from the amplified signal and produce an amplified, error-corrected signal at the output port. Both FIG. 2C feed forward amplifier 200C and FIG. 2B outphasing amplifier 200B can be implemented at the die level and at the package level.

BRIEF SUMMARY

Embodiments of the present disclosure generally relate to added isolation between transistors in a multiple path amplifier circuit.

In particular, one or more embodiments include a multiple path amplifier circuit including a substrate, a first transistor on the substrate in a first path, and a second transistor on the substrate in a second path. The multiple path amplifier circuit also includes at least one electrical connection associated with the first and the second transistors and positioned to at least partially extend between the first path and the second path.

In some embodiments, the first path can include an input phase shift, wherein the input phase shift is deposited between the first transistor and the second transistor. In some embodiments, the first path can include an output phase shift, wherein the output phase shift is deposited between the first transistor and the second transistor. In some embodiments, the first path can include an output combiner, wherein the output combiner is deposited between the first transistor and the second transistor. For example, the first path can include an output phase shift, wherein the output phase shift is deposited between the first transistor and the second transistor. In some embodiments, the first path can be deposited on a surface of the substrate. In some embodiments, the first path is deposited in the substrate. In some embodiments, the multiple path amplifier circuit can be a Doherty amplifier. In some embodiments, the distance between the first transistor and the second transistor is in a range of 500 to 3000 μm. In some embodiments, the multiple path amplifier circuit further includes a third transistor and a second path, wherein the second path is associated with the third transistor and the first transistor and/or the second transistor, and a second distance between the third transistor and the first transistor and/or the second transistor provides for the second path.

One or more other embodiments include an RF amplifier circuit, the RF amplifier circuit can include a substrate, a first transistor, and a second transistor. The RF amplifier circuit can also include a first path associated with both the carrier transistor and the peaking transistor, wherein a distance between the carrier transistor and the peaking transistor provides for the first path.

In some embodiments, the first path includes an input phase shift, wherein the input phase shift is deposited between the first transistor and the second transistor. In some embodiments, the first path includes an output phase shift, wherein the output phase shift is deposited between the first transistor and the second transistor. In some embodiments, the RF amplifier circuit can operate at a frequency of over 1 GHz. In some embodiments, the first transistor can be a gallium nitride (GaN) based high electron mobility transistor (HEMT). In some embodiments, the first transistor can include a silicon-based laterally-diffused metal-oxide semiconductor (LDMOS). In some embodiments, the first transistor includes a complementary metal-oxide-semiconductor (CMOS). In some embodiments, the first transistor can be a gallium arsenide (GaAs) transistor. In some embodiments, the first path can include splitting, combining, matching, and/or harmonic circuitry.

One or more other embodiments include a Doherty amplifier circuit, the Doherty amplifier circuit including a substrate, a main transistor on the substrate in a first path, and a peaking transistor on the substrate in a second path. The Doherty amplifier can also include at least one electrical connection associated with the first and the second transistors and positioned to at least partially extend between the first path and the second path.

Of course, those skilled in the art will appreciate that the present embodiments are not limited to the above contexts or examples, and will recognize additional features and advantages upon reading the following detailed description and upon viewing the accompanying drawings.

BRIEF DESCRIPTION OF THE DRAWINGS

Aspects of the present disclosure are illustrated by way of example and are not limited by the accompanying figures with like references indicating like elements. In general, the use of a reference numeral should be regarded as referring to the depicted subject matter according to one or more embodiments, whereas discussion of a specific instance of an illustrated element will append a letter designation thereto (e.g., discussion of a phase shifter 240A, generally, as opposed to discussion of particular instances of phase shifters 240A, 245A).

FIGS. 3A, 3B, and 3C are schematic diagrams illustrating example circuit layouts of an integrated Doherty amplifier, according to embodiments of the present invention.

DETAILED DESCRIPTION

Figure 1A:
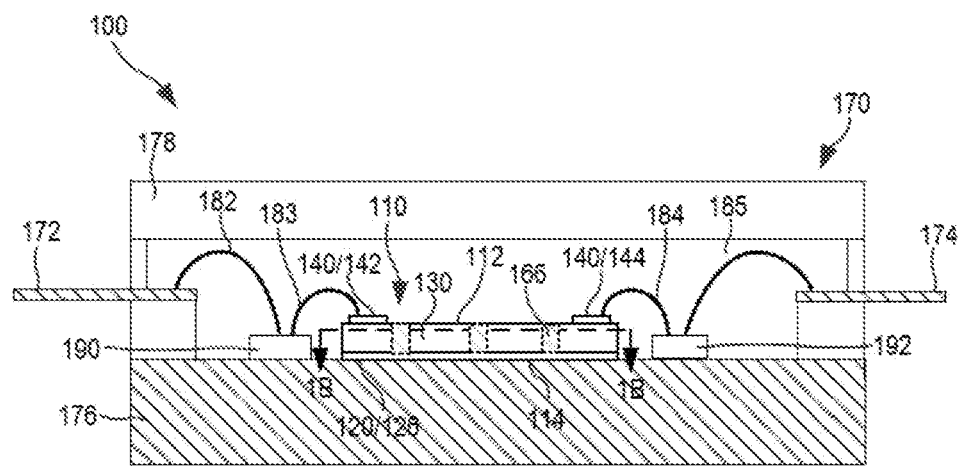
FIG. 1A is a conventional packaged RF amplifier schematic cross-section as known in the prior art.
Figure 1B:
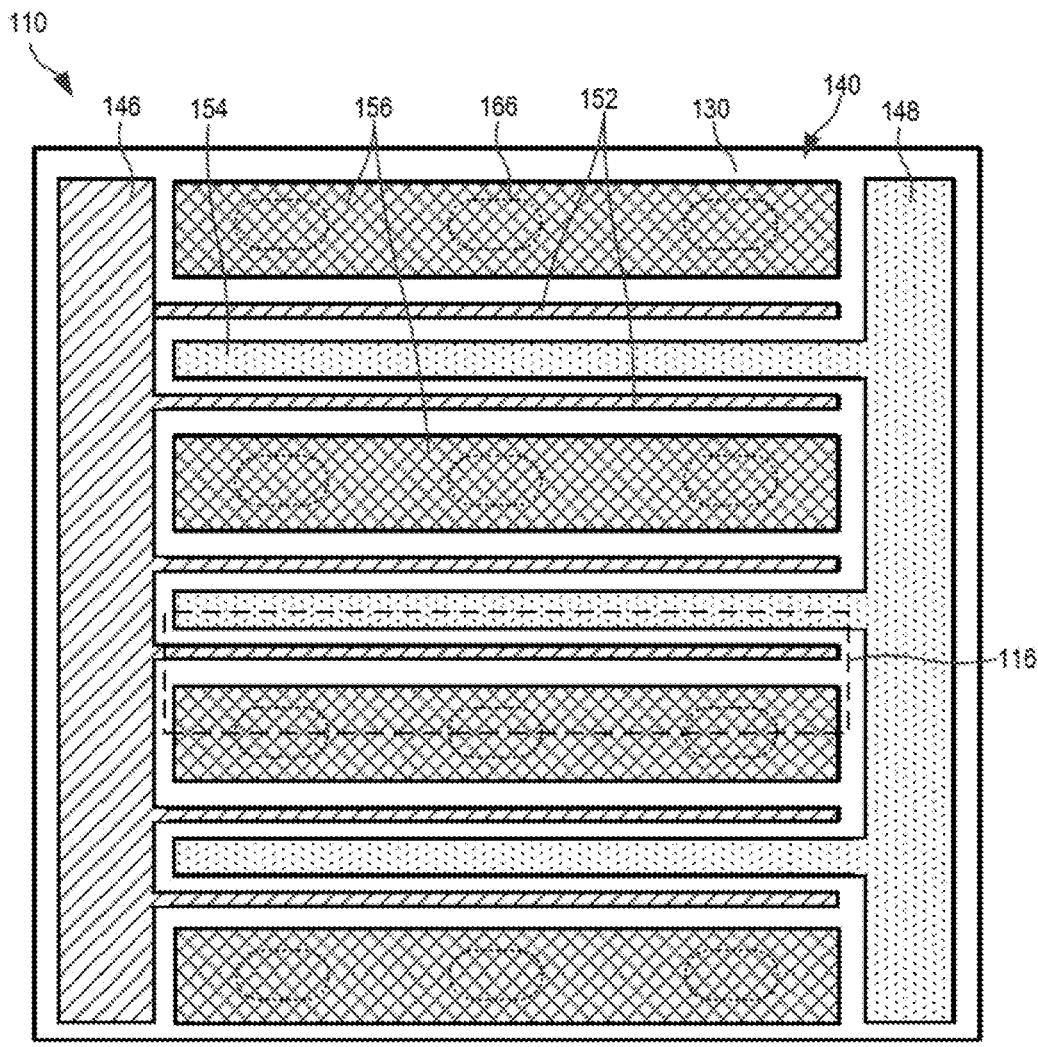
FIG. 1B is a schematic top of chip cross-sectional view of an RF amplifier die as known in the prior art.
Figure 1C:
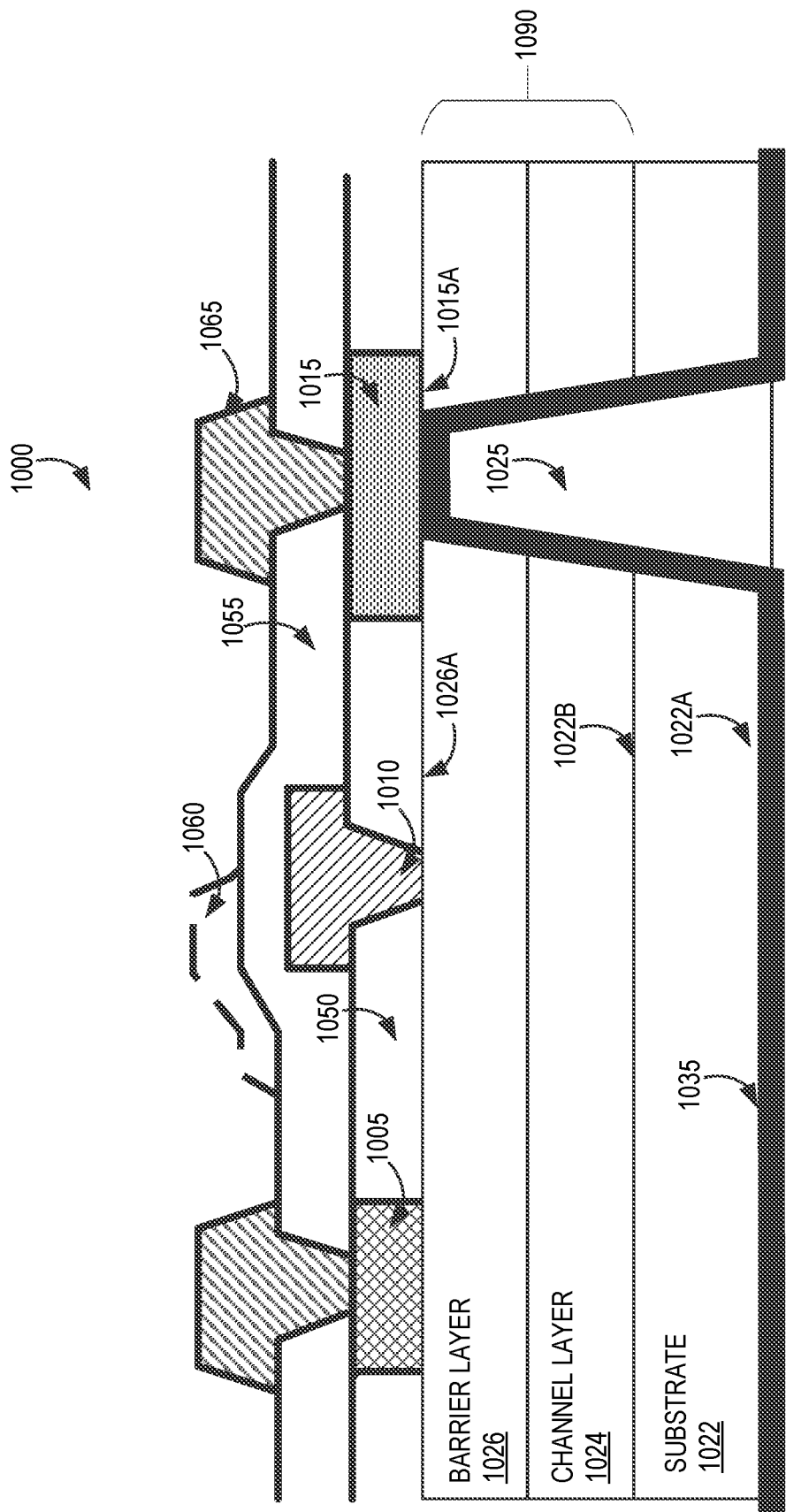
FIG. 1C is a schematic cross-sectional view of a conventional HEMT device as known in the prior art.
Figure 1D:
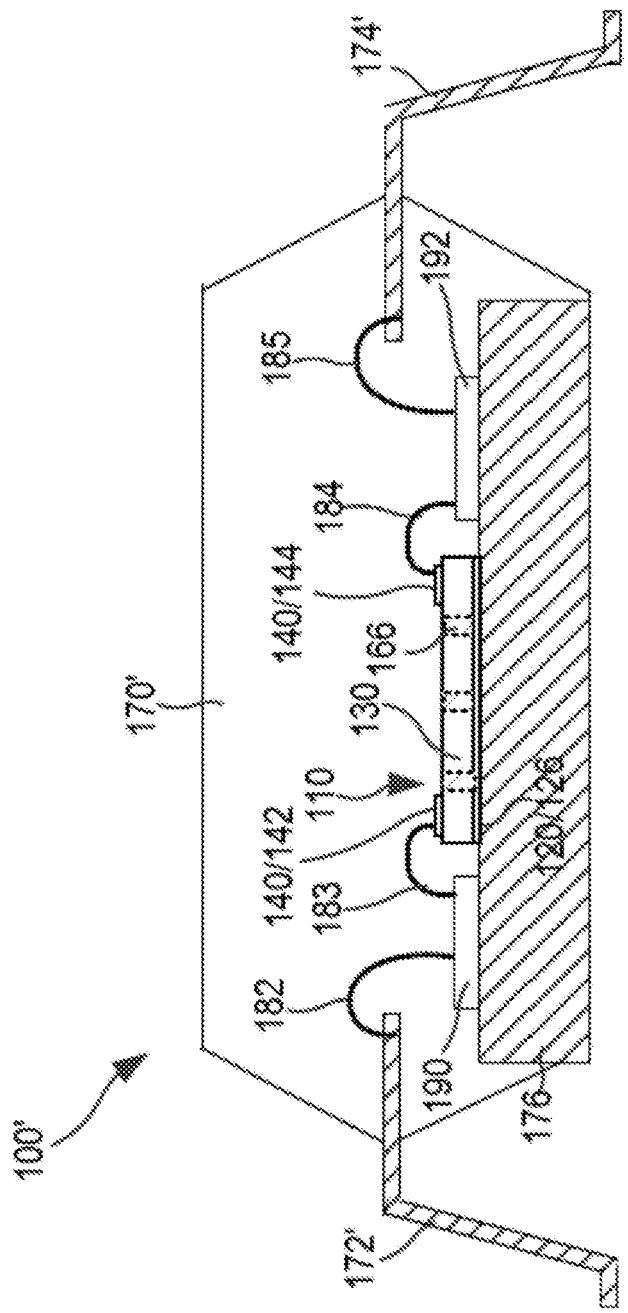
FIG. 1D is a schematic cross-sectional view of an RF amplifier die as known in the prior art.
Figure 1E:
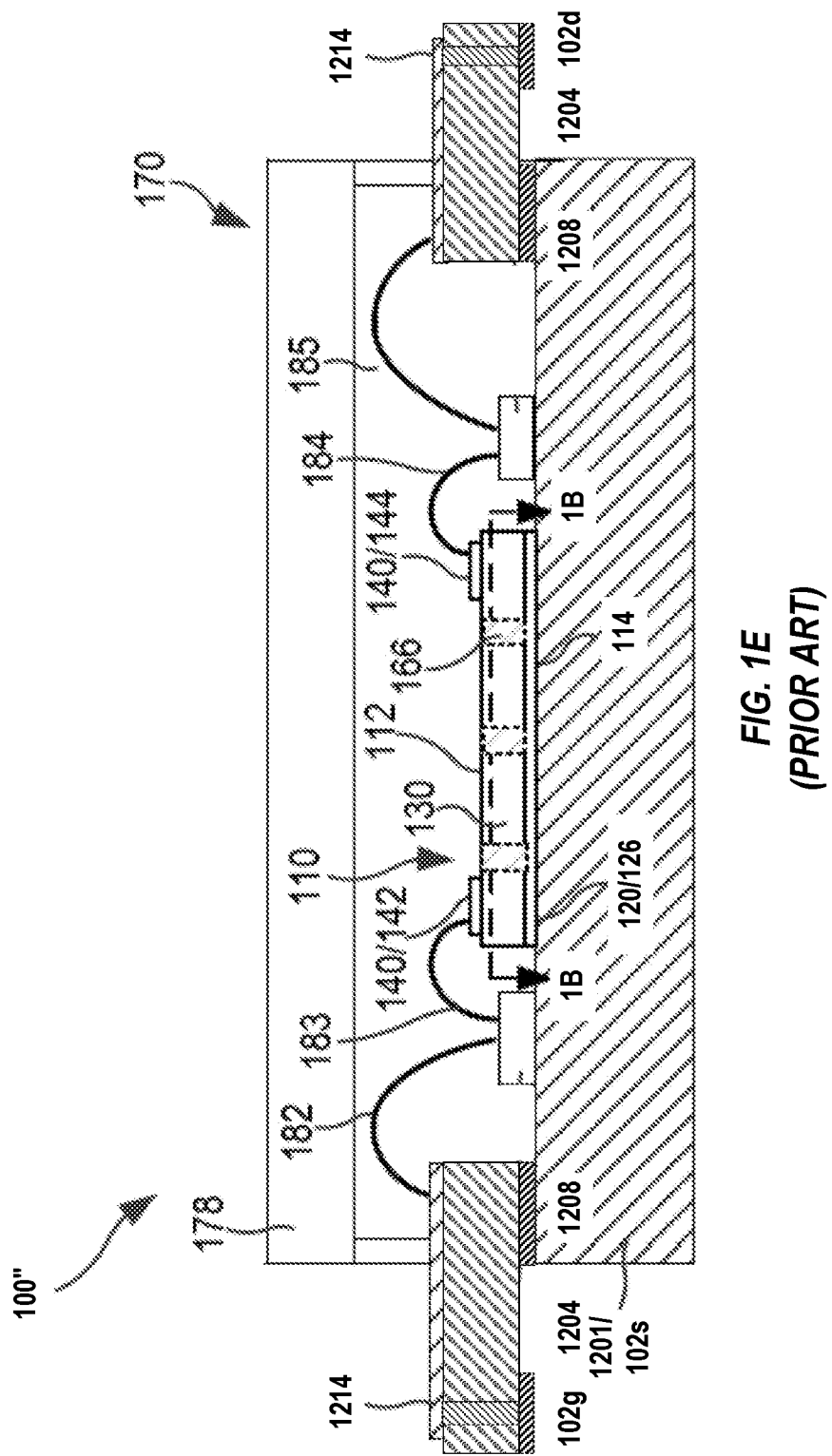
FIG. 1E is a cross-sectional view of a thermally enhanced IC device package as known in the prior art.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Although conventional integrated Doherty amplifiers can provide many benefits, the proximity of the main and peaking transistors can degrade their RF performance due to coupling through the semiconductor substrate between the two. This coupling may, among other things, produce lower gain and/or lower efficiency. Embodiments of the present disclosure layout all or part of the integrated Doherty amplifier such that these negative coupling effects are mitigated or avoided.

In several embodiments, the main and peaking transistors are positioned further away from each other than they normally would be, often such that additional circuitry may be disposed between them. According to one or more particular examples, input and/or output matching networks are disposed between the main and peaking transistors on the chip. The additional distance relative to conventional layouts results in reduced coupling through the substrate between the main and peaking transistors such that RF performance may be improved. Further, one or more circuits disposed between the main and coupling transistors may be passive elements that can be electromagnetically simulated such that the coupling between the passive elements can be incorporated into the design. In many embodiments, this approach does not require an increase to the overall die size, and particular circuits may be moved to different areas of the chip as needed.

Certain embodiments can be utilized in the structure described in FIGS. 1A-E. However, other embodiments are possible. For example, different packaging structures can be used. Also, different chip structures can be utilized with source and/or drain vias, no vias, and/or additional or intervening epitaxial layers. Additionally, the matching GaN HEMTs can be discrete transistors, and additional matching and/or harmonic termination or other discrete circuitry can be packaged with the GaN HEMTs, e.g., as main and peak transistors in a Doherty amplifier package. Alternatively, the transistors can be formed together with other circuitry on the same substrate as part of a monolithic microwave integrated circuit (MIMIC).

FIGS. 3A-C schematically illustrate different example layouts of integrated Doherty amplifiers according to particular embodiments of the present disclosure. In each of the examples of FIGS. 3A-C, a main transistor 310A-C receives a signal, and a peaking transistor 320A-C receives the same signal phase shifted by phase shift 340A-C.

Figure 4A:
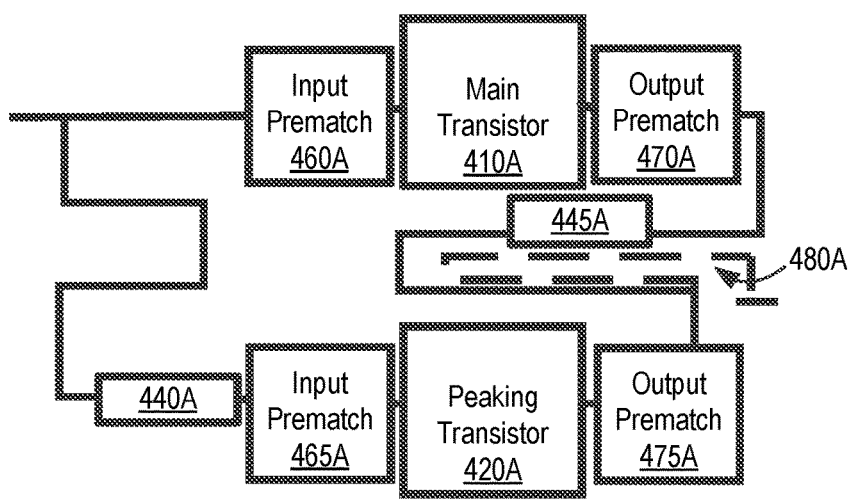
FIGS. 4A, 4B, and 4C are schematic diagrams illustrating additional example circuit layouts of an integrated Doherty amplifier that include input and output prematching circuitry, according to embodiments of the present disclosure.
Figure 4B:
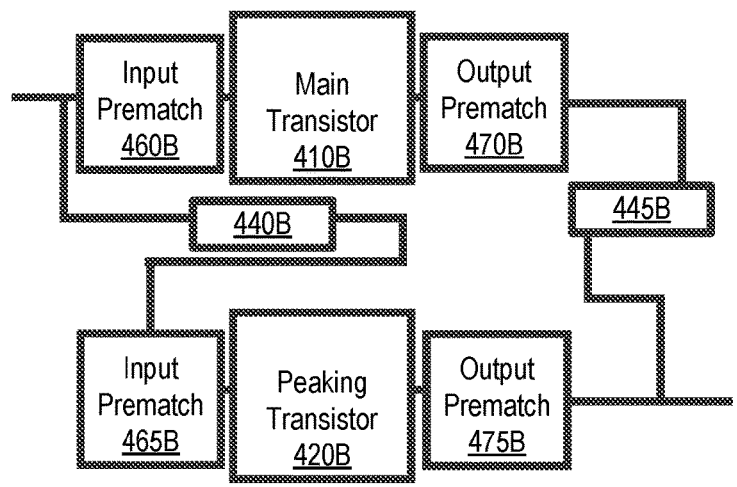
Figure 4C:
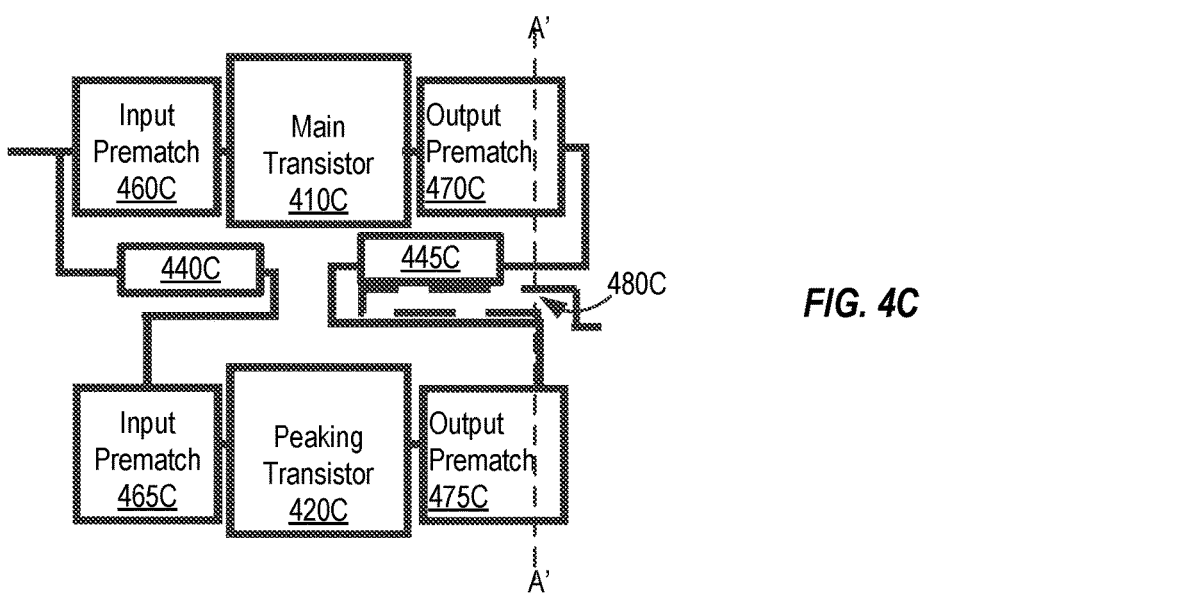

Notably, in each of the examples of FIGS. 3A-C, the phase shift 340A-C and/or the phase shift 345A-C is at least partly disposed between the main and peaking transistors 310A-C, 320A-C. In particular, in the example of FIG. 3A, the phase shift 345A is partly disposed between the main and peaking transistors 310A, 320A. In the example of FIG. 3B, the phase shift 340B is partly disposed between the main and peaking transistors 310B, 320B. In the example of FIG. 3C, the phase shift 340C and the phase shift 345C are each partly disposed between the main and peaking transistors 310C, 320C As discussed above, integrated Doherty amplifiers may include matching circuitry on the same die with the main and peaking transistors. Such matching circuitry may include, for example, an impedance matching network, a quadrature coupler, and quarter-wavelength transmission line, and/or phase shifter on the input and/or output side of the main and peaking transistors, as discussed above. In some embodiments, the matching circuitry additionally or alternatively comprises pre-matching circuitry that further adapts signals to more accurately obtain desired amounts of impedance and/or phase shift in view of, e.g., circuit length constraints, reactive effects, and/or parasitic effects. FIGS. 4A-C schematically illustrate different example layouts of integrated Doherty amplifiers that include input and output pre-matching circuitry for each of the main and peaking transistors, in accordance with particular embodiments of the present disclosure. These examples also illustrate different examples of integrated Doherty amplifiers that support different input and output schemes, according to embodiments of the present disclosure.

In contrast to the embodiments of FIGS. 3A-C, as well as the examples of FIGS. 4A-C, imperfections, constraints, and other practical variations may be accommodated in some embodiments by appropriate matching performed by the main and peaking input pre-matching circuitry 460A-C and 465A-C, respectively. Peaking input pre-matching circuitry 465A-C and peaking output pre-matching circuitry 475A-C is also included. Output combiner 480A, 480C combines the output of main transistor output prematches 470A, 470C and peaking transistor output prematches 475A, 475C respectively.

The example of FIG. 4A comprises a phase shift 445A between the main and peaking transistors 410A, 420A while phase shift 440A may not be. The example of FIG. 4B comprises a phase shift 440B partly disposed between the main and peaking transistors 410B, 420B while phase shift 445B may not be. The example of FIG. 4C comprises the output network features discussed above with respect to FIG. 4A and the input network features discussed above with respect to FIG. 4B. That is, in the example of FIG. 4C, phase shift 440C and phase shift 445C are each partly disposed between the main and peaking amplifiers 410C, 420C.

Figure 5:
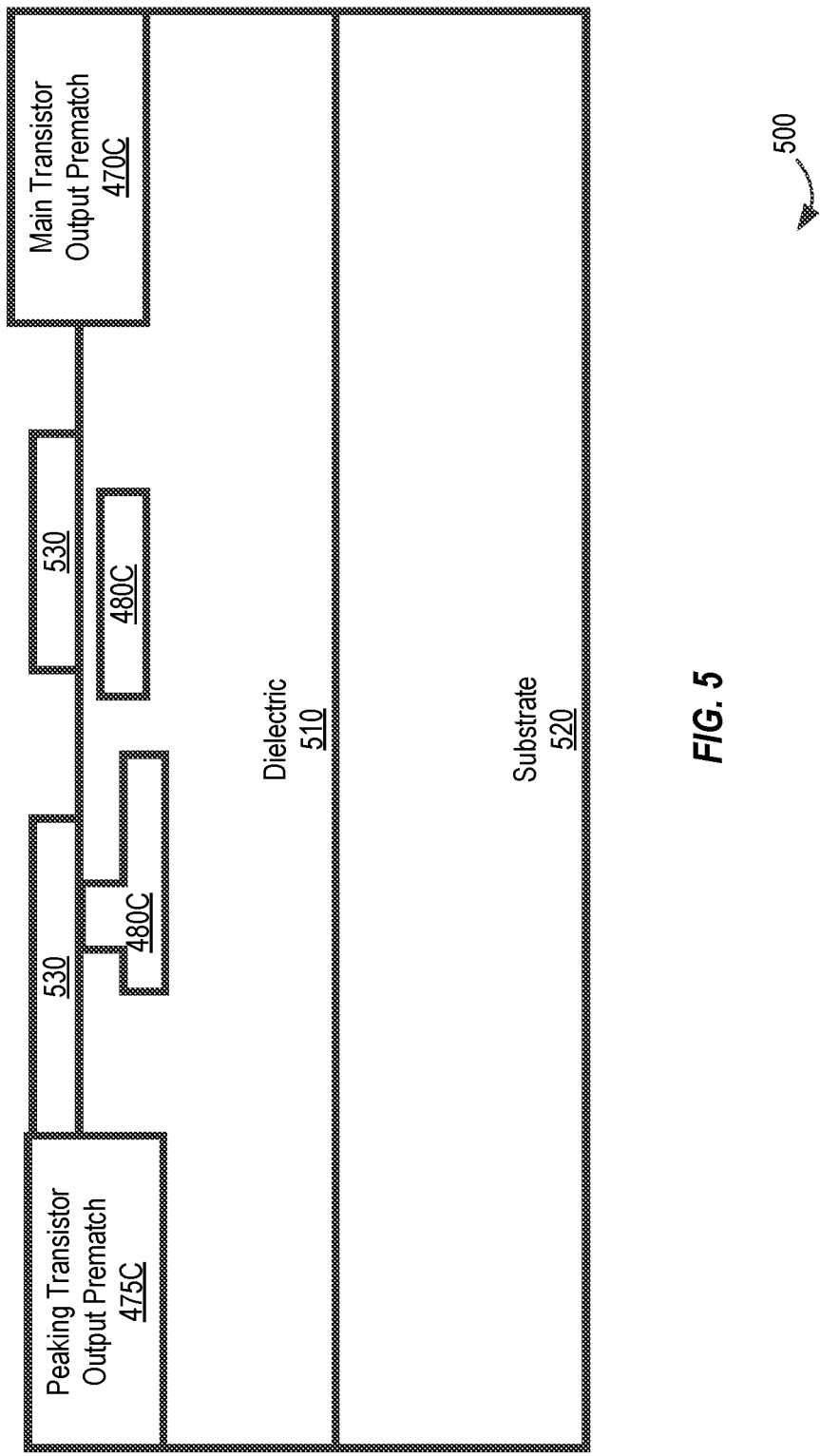
FIG. 5 is a cross-sectional view taken along line A'-A' of FIG. 3C.

FIG. 5 is a schematic cross-sectional view at the die level illustrating a portion of the output network of an example semiconductor 500 into which circuitry is formed or onto which circuitry is mounted, consistent with, e.g., A' of FIG. 4C discussed above. FIG. 5 shows a MMIC with all components of a Doherty amplifier on the die. The semiconductor 500 comprises a dielectric layer 510 and a substrate layer 520. The dielectric layer 510 may be formed on the substrate layer 520, and circuitry may be formed in one or more inner layers of the dielectric layer 510 or mounted onto a top layer of the dielectric layer 510.

In this example, main and peaking output pre-matching circuitry 470C, 475C, as well as main and peaking output paths 530 are mounted to a top layer of the dielectric layer 510 of the substrate 520. As shown in FIG. 5, a first output path part 530 descends from the top layer into an inner layer of the dielectric layer 480C. In this example, the main and peaking output pre-matching circuitry 470C, 475C are placed on the dielectric layer, such that at least a portion of the output path 530 is disposed between the main and peaking output pre-matching circuitry 470C, 475C.

Figure 6:
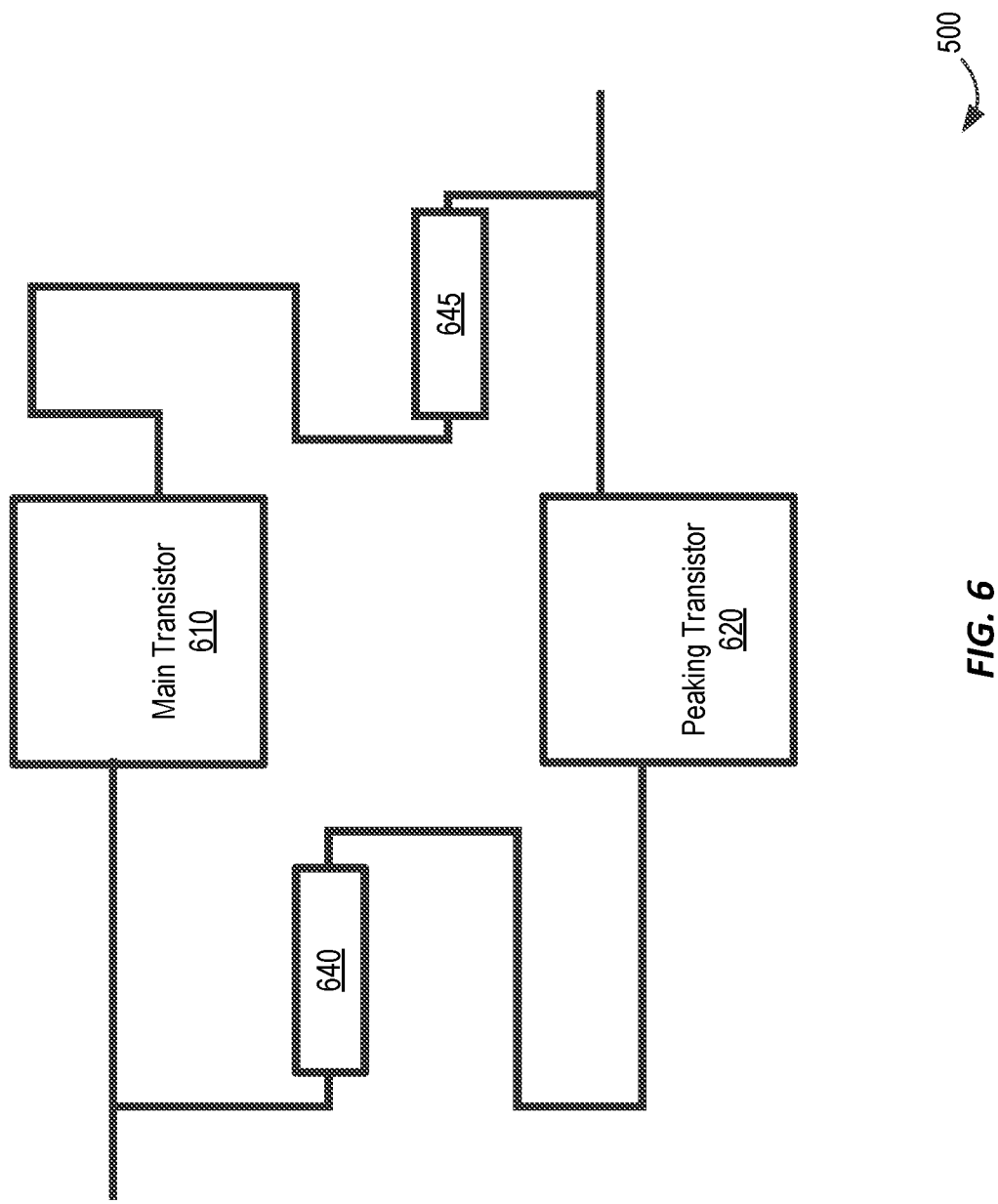
FIG. 6 is a schematic diagram illustrating an example circuit layout of an integrated Doherty amplifier, according to a further embodiment of the present invention.

According to other embodiments of the present disclosure, neither the peaking input path nor the main output path is disposed between the main and peaking transistors 610, 620, as shown in the example of FIG. 6. In this particular example, main and peaking transistors 610, 620 are mounted along an axis bisecting the amplification stage of the Doherty amplifier. In this particular example, there is no circuitry (e.g., phase shift 640 and phase shift 645) disposed between the main and peaking transistors 610, 620. Nonetheless, the main and peaking transistors 610, 620 are spaced farther away from each other than each of the lengths of the substantially parallel parts of the peaking input path and main output path. For example, the distance between the main and peaking transistors 610, 620 can be 500 to 3000 μm.

Figure 2A:
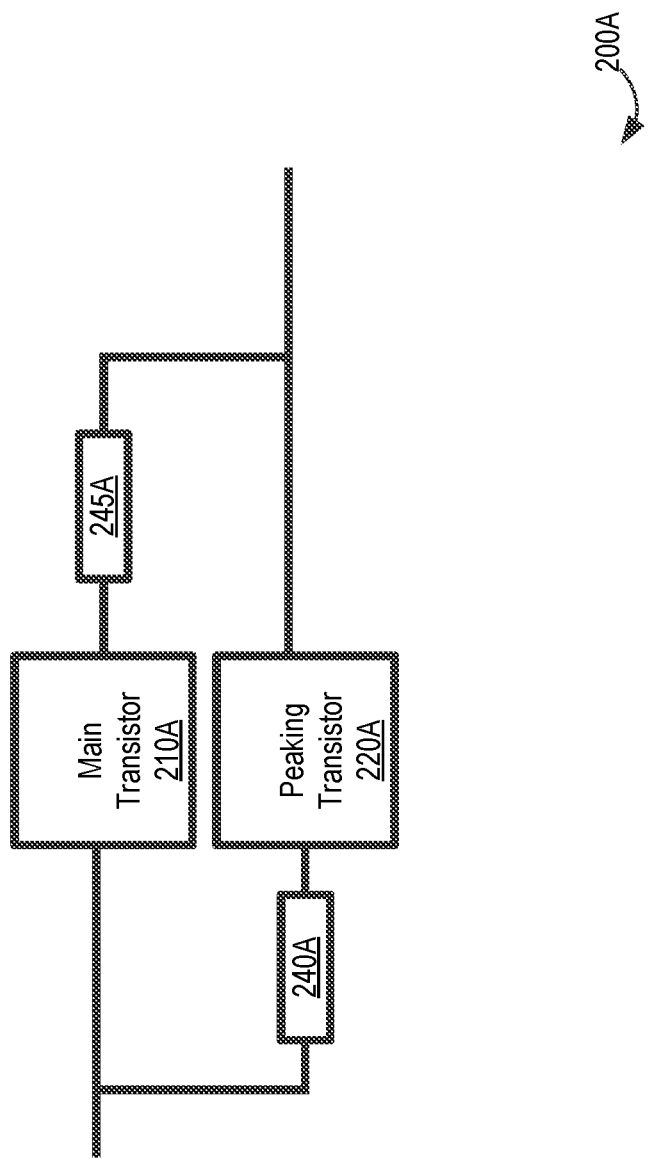
FIG. 2A is a schematic diagram illustrating a conventional amplifier as known in the prior art.
Figure 2B:
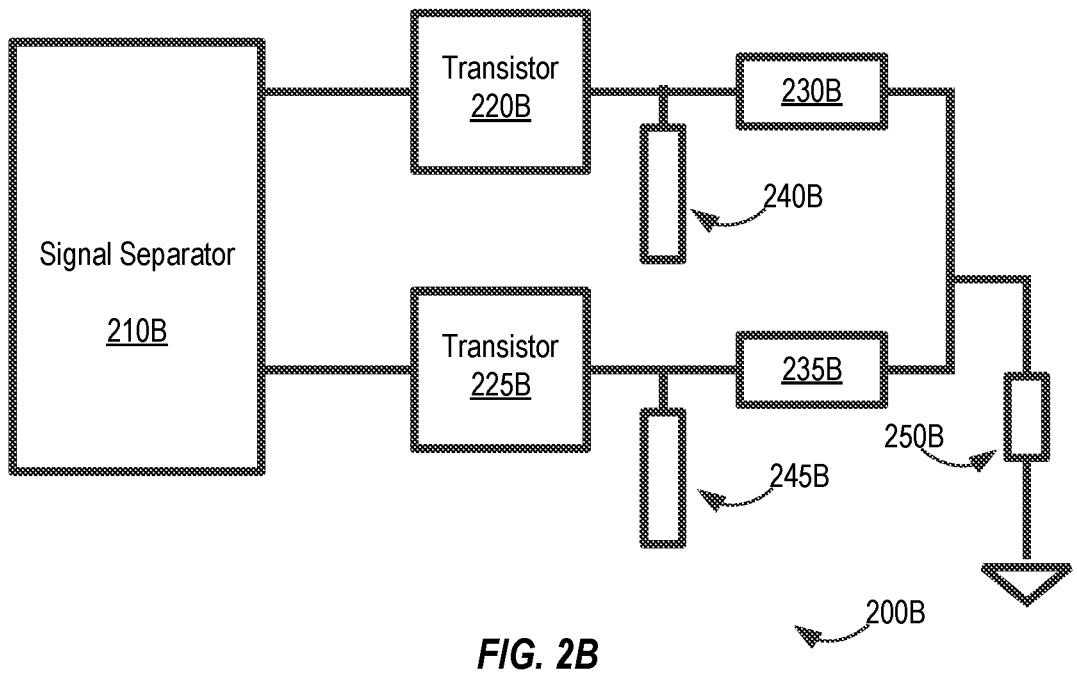
FIG. 2B is a schematic diagram illustrating a circuit layout of conventional outphasing power amplifier, as known in the prior art.
Figure 7:
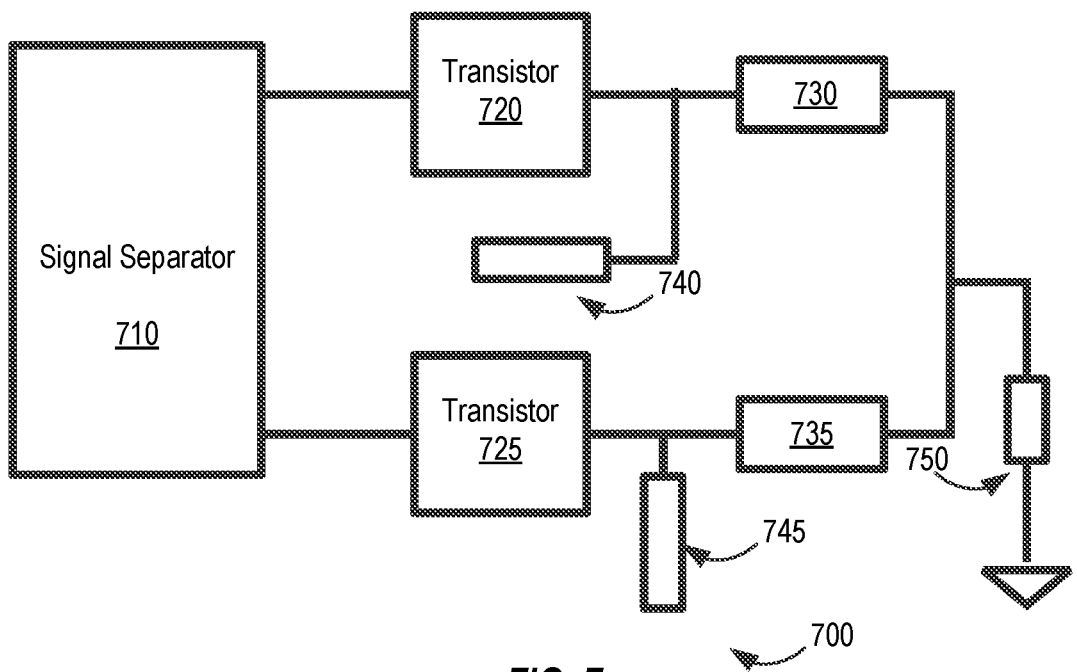
FIG. 7 is a schematic diagram illustrating an example circuit layout of an outphasing power amplifier according to further embodiments of the present invention.

Other embodiments of the present disclosure include layouts that may be advantageously used with other kinds of amplifiers. In contrast to the traditional outphasing amplifier 200B of FIG. 2B, FIG. 7 shows an outphasing amplifier 700 according to embodiments of the present disclosure. The outphasing amplifier 700 shows a signal separator 710 with phase shifters 730, 735 and an output port 750. One or both of the branches 740, 745 providing load regulation may be disposed at least partially between transistors 720, 725, e.g., to arrange circuitry in a way that reduces coupling between the transistors 720, 725. FIG. 7 illustrates an example of such a layout.

Figure 2C:
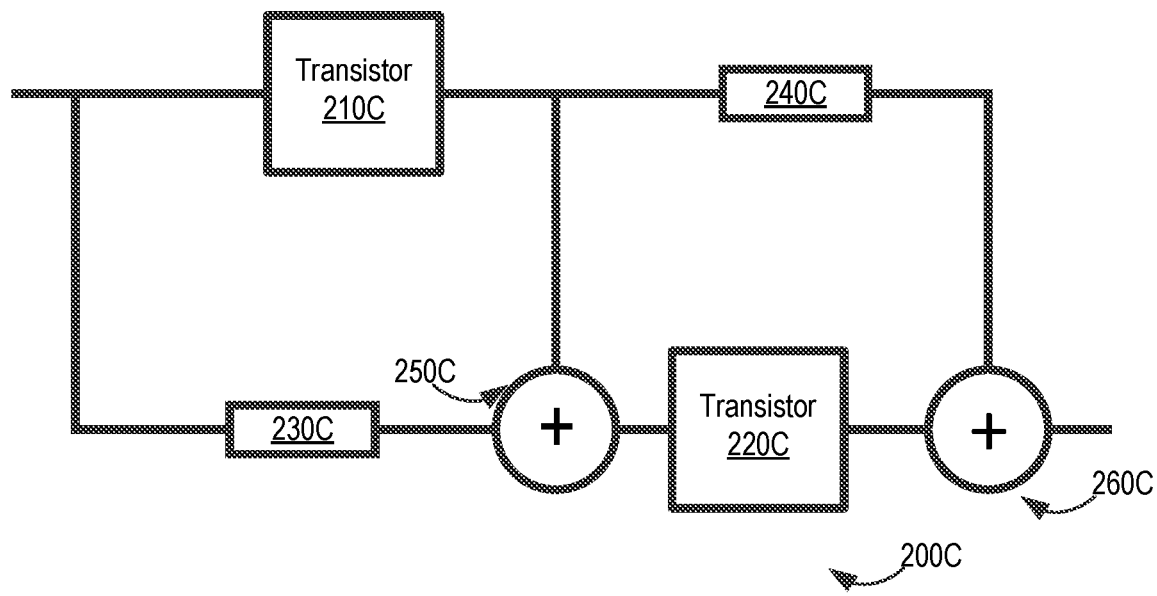
FIG. 2C is a schematic diagram illustrating a circuit layout of a conventional feed forward amplifier as known in the prior art.
Figure 8:
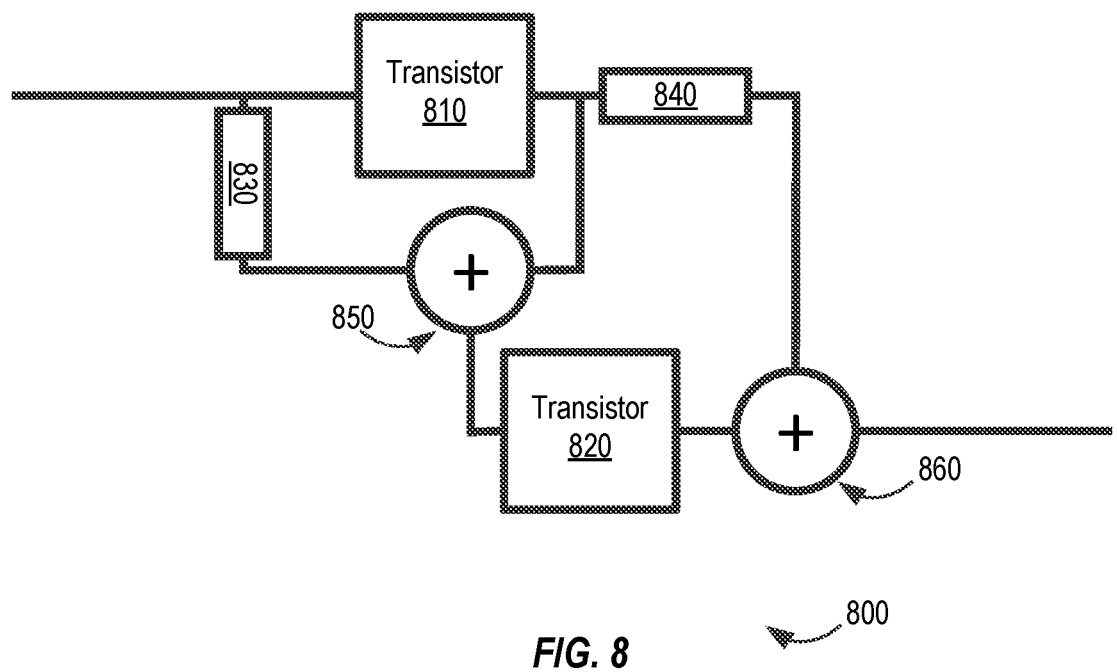
FIG. 8 is a schematic diagram illustrating an example circuit layout of a feed forward amplifier according to further embodiments of the present invention.

In contrast to the traditional feedforward amplifier 200C of FIG. 2C, FIG. 8 shows a feedforward amplifier 800 according to some embodiments of the invention. Similar to FIG. 2C, feedforward amplifier 800 shows transistors 810, 820 with phase shifters 830, 840 and combiners 850, 860. In FIG. 8, transistors 810, 820 may be mounted such that a first combiner 850 is positioned between transistor 810 and transistor 820. FIG. 8 illustrates an example of such a layout.

Figure 9:
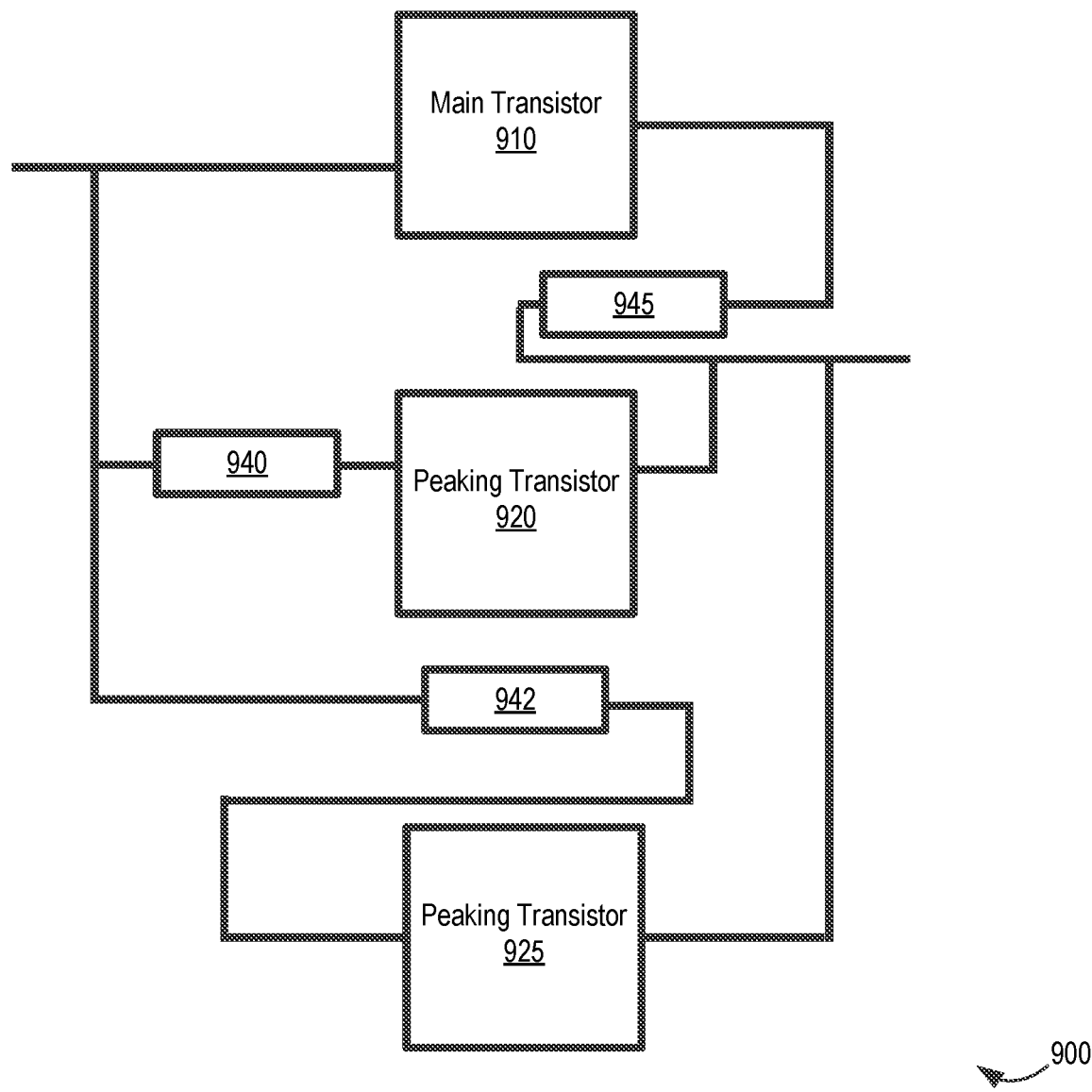
FIG. 9 is a schematic diagram illustrating an example circuit layout of a multi peaking transistor Doherty amplifier according to further embodiments of the present invention.

FIG. 9 shows a multi peaking transistor Doherty amplifier 900 according to further embodiments of the present invention. The amplifier 900 includes a main transistor 910, a first peaking transistor 920 and a second peaking transistor 925. As shown, the phase shift 945 for the main transistor 910 output is between the main transistor 910 and the first peaking transistor 920. In FIG. 9, phase shift 940 that is shown as input into the first peaking transistor 920 can alternatively be between the main transistor 910 and the first peaking transistor 920 or the first peaking transistor 920 and the second peaking transistor 925. Phase shift 942 shifts the phase of the signal input for the second peaking transistor 925. As shown, the phase shift 942 is between the first peaking transistor 920 and the second peaking transistor 925. In some embodiments, any of the phase shifts 940, 942, 945 can be located between either the main transistor 910 and the first peaking transistor 920 or between the first peaking transistor 920 and the second peaking transistor 925. In some embodiments, more than one phase shift can be between two of the transistors.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein. Although steps of various processes or methods described herein may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention.

What is claimed is:

1. A Doherty amplifier circuit comprising:
   a substrate;
   a main transistor disposed on the substrate in a first position;
   a peaking transistor disposed on the substrate in a second position parallel to the first position;
   an intermediate area of the substrate extending between the main and peaking transistors; and
   at least one of an input or output phase shift connected to the main or the peaking transistors disposed on the substrate at least partially within the intermediate area, and hence extending at least partially between the main transistor and the peaking transistor;
   whereby separation of the main and peaking transistors by the input or output phase shift, harmonic termination, or impedance matching circuitry in the intermediate area mitigates coupling between main and peaking transistors through the substrate.

2. The Doherty amplifier circuit of claim 1, wherein the Doherty amplifier circuit operates at a frequency of over 1 GHz.

3. The Doherty amplifier circuit of claim 1, wherein the main transistor is a gallium nitride (GaN) based high electron mobility transistor (HEMT).

4. The Doherty amplifier circuit of claim 1, wherein at least part of a combiner is deposited within the intermediate area between the first transistor and the second transistor.

5. The Doherty amplifier circuit of claim 4, wherein at least part of an output combiner is deposited within the intermediate area between the first transistor and the second transistor.

6. The Doherty amplifier circuit of claim 1, wherein the input or output path is deposited on a surface of the substrate.

7. The Doherty amplifier circuit of claim 1, wherein the input or output path is deposited within a dielectric layer formed on the substrate.

8. The Doherty amplifier circuit of claim 1, wherein the main transistor comprises a silicon-based laterally-diffused metal-oxide semiconductor (LDMOS) transistor.

9. The Doherty amplifier circuit of claim 1, wherein a distance between the first transistor and the second transistor is in a range of 500 to 3000 μm.

10. The Doherty amplifier circuit of claim 1, further comprising a third transistor, wherein:
    at least one of an input or output phase shift connected to the first, second, or third transistors is positioned to at least partially extend between the first and second transistor or between the second and third transistor.

11. The Doherty amplifier circuit of claim 1, wherein the main transistor comprises a complementary metal-oxide-semiconductor (CMOS) transistor.

12. The Doherty amplifier circuit of claim 1, wherein the main transistor is a gallium arsenide (GaAs) transistor.

13. The Doherty circuit of claim 1, wherein at least part of one of splitting, combining, matching, and harmonic circuitry is deposited within the intermediate area between the main transistor and the peaking transistor.

* * * * *